(12) United States Patent
Hiraide

(10) Patent No.: US 7,266,746 B2
(45) Date of Patent: Sep. 4, 2007

(54) DEVICE AND METHOD FOR TESTING INTEGRATED CIRCUIT

(75) Inventor: Takahisa Hiraide, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 222 days.

(21) Appl. No.: 11/023,457

(22) Filed: Dec. 29, 2004

(65) Prior Publication Data

US 2005/0149804 A1 Jul. 7, 2005

Related U.S. Application Data

(63) Continuation of application No. PCT/JP02/09606, filed on Sep. 19, 2002.

(51) Int. Cl.
*G01R 31/28* (2006.01)

(52) U.S. Cl. ...................................... 714/738

(58) Field of Classification Search ...................... None
See application file for complete search history.

(56) References Cited

U.S. PATENT DOCUMENTS

| | | | | |
|---|---|---|---|---|
| 5,450,414 | A | * | 9/1995 | Lin ............................. 714/726 |
| 5,592,493 | A | * | 1/1997 | Crouch et al. ............... 714/729 |
| 5,831,996 | A | * | 11/1998 | Abramovici et al. ........ 714/738 |
| 6,256,759 | B1 | * | 7/2001 | Bhawmik et al. ............ 714/726 |
| 6,385,750 | B1 | * | 5/2002 | Kapur et al. ................. 714/738 |
| 6,708,305 | B1 | * | 3/2004 | Farnsworth et al. ........ 714/739 |
| 2002/0124217 | A1 | * | 9/2002 | Hiraide et al. ............... 714/726 |

FOREIGN PATENT DOCUMENTS

| | | |
|---|---|---|
| JP | 7-260897 | 10/1995 |
| JP | 2000-9813 | 1/2000 |
| JP | 2000-193726 | 7/2000 |
| JP | 2002-236144 | 8/2002 |

OTHER PUBLICATIONS

English language translation of "Fault Tolerant Computing, Maruzen Advanced Technology", (ed) Masao Mukaidono, Maruzen, Sep. 30, 1989. pp. 124-126, 128. (Copies of the first and back covers, table of contents, part pp. 124-129 of Japanese original are attached).

* cited by examiner

*Primary Examiner*—Cynthia Britt
*Assistant Examiner*—Steven D. Radosevich
(74) *Attorney, Agent, or Firm*—Staas & Halsey LLP

(57) ABSTRACT

The present invention provides an integrated circuit test device and method which creates a pattern for minimizing a difference from a pattern generated by a pattern generation device. In the invention, a list of all failures assumed to be in the circuit is created, and, for example, a random number pattern is inputted so that a signal value in the circuit is defined by a logic simulation using the inputted pattern, as a result of which the controllability, observability and testability are calculated. A target failure minimizing the testability is selected from the list, for which target failure path-sensitization is performed using the controllability and observability of the input pattern, which pattern is corrected so as to minimize the number of inversions of signal values of the input pattern. A failure simulation for the target failure is also performed using the corrected pattern, and when a failure to be detected further exists, the failure is removed from the failure list.

19 Claims, 13 Drawing Sheets

DEVICE AND METHOD FOR TESTING INTEGRATED CIRCUIT

CROSS-REFERENCE TO RELATED APPLICATION

This application is a continuing application, filed under 35 U.S.C. §111(a), of International Application PCT/JP02/09606, filed Sep. 19, 2002. The present application claims the benefit of PCT international application number PCT/JP/09606 filed on Sep. 19, 2002, the subject matter of which is incorporated herein by reference.

BACKGROUND OF THE INVENTION

1. Field of the Invention

The present invention relates to a device and method for testing an integrated circuit device, for detecting production failure of an integrated circuit (LSI).

2. Description of the Related Art

Detection of production failure of an integrated circuit (LSI) is performed such that a suitable signal value is applied to an input pin of the LSI by using a tester (ATE), and a signal value appearing at an output pin is compared with an expected result. A combination of the signal value of an input pin and the expected value of an output pin is referred to as a test pattern. A defect caused in a LSI by a production failure of the LSI is referred to as a fault, and in order to perform verification on all faults that may be caused in a LSI, a large number of test patterns are required. In addition, a ratio of faults which can be verified to faults which can be assumed to be in the LSI by a test pattern is referred to as a diagnosis rate (or detection rate), which is used as a measure when the quality of the test pattern is evaluated.

The method for creating a test pattern includes the following:

Random Test Generation (RTG)
Manual Test Generation
Automatic Test Pattern Generation (ATPG)

Although the above described methods are combined to be used as required, the ATPG is used widely in order to obtain a high diagnosis rate. There are several methods in the ATPG, but those belonging to a path-sensitization algorithm are currently prevailing methods.

The path-sensitization algorithm consists of two fundamental steps of fault excitation and fault-effect propagation, for detecting a fault.

In the fault excitation, a value opposite to a fault value is set at a failure-assumed point. This makes a state value in a fault point different between a case where a fault is present and a normal case. This state is referred to that a failure is excited.

In addition, the fault-effect propagation is to propagate the effect of an excited failure to an observation point (external output). This makes all signal values on a path from a fault point to an observation point different between a normal time and a failure time. The path is referred to as a sensitized path. An example of the sensitized path is shown in FIG. 10. A thick solid line shows the sensitized path in a circuit shown in FIG. 10. The sensitized path also shows that a signal value for fault-excitation is set on a signal line a, and a signal value for fault-effect propagation is set on a signal line c and a signal line d.

In order to realize the fault excitation and the fault-effect propagation, it is necessary to set a desired signal value on a specified signal line. A signal line value in a circuit will be eventually resulted in a signal value of an external input which is a control point of a LSI. That is, in order to detect a fault, the ATPG creates a test pattern which consists of signal values of an external input for forming a sensitized path of the fault and expected values (signal values expected at a normal time) of an output to which the effect of the fault is propagated.

Several selections may take place in a process in which the ATPG creates a test pattern. For example, when a fault is excited by setting the output of a two-input AND gate to 0, either of the two inputs may be 0, so that either of the two inputs needs to be selected as the input to be set to 0. Also, in the case where there is a branch point of a signal line in the course of failure propagation, either one of the paths may be sensitized, so that a selection is also required in this case.

In a common ATPG, when several options exist, it is necessary to select one of them for the time being to advance processing. However, when the selection results in generation of a discrepancy in setting signal values or in a failure to sensitize the path, it is necessary to return to the processing of one previous step where the selection was performed and to select another option so as to advance processing. This is referred to as back-tracking.

In the case where a LSI includes a sequential circuit elements (flip-flop (F/F), latch and RAM), the complexity of the test pattern creation is drastically increased. Accordingly, there is performed a scan designing, in which a shift register (referred to as scan path) is formed by sequential circuit elements mainly comprising F/Fs in the LSI, so as to make a desired value shifted in at the time of test and values of the shift register read out to the outside after clock application. A technique referred to as the Deterministic Stored Pattern Test (DSPT), which is performed by storing in a tester a test pattern created by the ATPG, is widely employed for a circuit designed with the scan designing. FIG. 11 is a conceptual diagram of the DSPT. In the DSPT, a test pattern TP1 is shifted in a scan path SP provided in the LSI, so that a test pattern TP2 is shifted out.

However, since sequential circuit elements included in a LSI has recently increased drastically with high integration of the LSI, the DSPT which repeats the setting and reading operations for every test pattern for all sequential circuit elements constituting a scan path, causes to increase test time and data, so as to be difficult to be applied. Especially the shortage of memory capacity of a tester due to the increase in the amount of test data results in a memory expansion and an upgrade of the tester, thereby substantially increasing test costs.

In order to solve the problem, a Built-In Self Test (BIST) has come to be applied. FIG. 12 is a conceptual diagram of the BIST. In the BIST, a random pattern generated in a pseudo random number pattern generator 91 is applied to an internal circuit 90 of a LSI, and the output result is verified and stored in an output verification device 92. A linear feedback shift register (LFSR) is used, in many cases, for the pseudo random number pattern generator 91 and the output verification device 92, and the latter is in particular referred to as a multi-input signature register (MISR) as it compresses and stores the output result as a signature.

In the BIST, in which a pattern generator is installed in a LSI so that an input test pattern need not be stored in an external tester, and in which the test result is compressed by the MISR, the amount of data to be loaded in the tester can be drastically reduced. In the BIST, the number of scan paths is increased to enable the operation speed of shifting in and shifting out of a scan path to be increased, thereby reducing the test time.

Although the BIST is capable of improving the above described problem of the DSPT, it also has several disadvantages. In the BIST, since a pseudo random number pattern is used, a problem is involved in the test quality (diagnosis rate). In order to enhance the diagnosis rate, it is necessary to apply the DSPT as an additional test or to insert test points in the circuit inside the LSI so as to increase the controllability and observability.

Also, since the BIST is constructed such that output data are compressed and stored in the MIST, when an indeterminate state (X value) is taken in the MISR, the indeterminate value destroys the values in the MISR, thereby making it impossible to test. Generally, since sequential circuit elements including RAM in a LSI are in an indeterminate state when the power supply is turned on, it is necessary to initialize the sequential circuit elements or to devise a circuit for preventing the indeterminate state from being propagated to the MISR.

Further, it is necessary to devise in designing a bus to prevent a random pattern from causing a conflict and floating in the bus, which forces a strict design limitation on a designer when the BIST is applied to an actual circuit. In addition, a problem is also caused by an area overhead and performance degradation, which result from additional circuits and test points inserted for use in the BIST.

In order to solve the above described problems of the DSPT and BIST, a related test device and method are proposed in Japanese Patent Application Serial No. H12-372231, "Device and Method for Testing Integrated Circuit", which enables a test time and the amount of test data to be reduced and the high quality of test to be attained.

FIG. 13 shows a block diagram of a circuit of a test device disclosed in the above described patent application. In the related art disclosed in the patent application, which is based on the BIST circuit, a pattern created by a pseudo random number pattern generator (LFSR) 93 is corrected by a pattern correction device 94 to be a pattern equivalent to that created by the ATPG, so as to be shifted in a scan path. After application of a test clock, the scan path output, of which indeterminate state values are subjected to mask-processing in an indeterminate state masking device 95, is compressed and stored in the MISR in an output verification device 96.

In general, the number of patterns created by the ATPG, values of which patterns are explicitly set to F/Fs, is very small compared with the total number of F/Fs (several %). In the technique disclosed in the above described patent application, only the values explicitly set to the F/Fs are provided for an external tester through a control signal 97, so as to enable a pseudo random number pattern to be corrected to be a high quality pattern equivalent to that created by the ATPG through the pattern correction device 94. Also, indeterminate state values which causes a design limitation in the BIST are blocked by the indeterminate state masking device 95 from being taken in the MISR, thereby substantially reducing a burden on a designer.

Thus, in the technique disclosed by the patent application, any test pattern generated by any kind of ATPG can be utilized. However, in order to substantially reduce test costs, such as the amount of test data and test time, the difference between a random pattern generated by the LFSR 93 provided inside the circuit and a pattern generated by the ATPG needs to be small.

Here, the ATPG determines values of several F/Fs necessary for several target failures and a number of remaining F/Fs are set to values created by the LFSR 93 provided in the circuit. This enables the difference between a random pattern and a test pattern to be made small. However, in the case where there are a number of target failures, or where sensitization is complicated, the number of F/Fs which need to be set by the ATPG is increased, as a result of which the test cost reduction rate is lowered.

In the related art disclosed in the above described patent application, F/F values set by the ATPG have no relation to F/F values set by the LFSR. F/F values set by the ATPG may be identical with half of F/F values set by the LFSR, but on the average, in the half of F/Fs set by the ATPG, additional patterns are created by the tester, which lowers the test cost reduction rate.

Accordingly it is an object of the present invention is to provide a test device and method for performing a test pattern creation so as to make the difference from a random number pattern generated by a pseudo random number pattern generator as small as possible, thereby increasing the test cost reduction rate.

SUMMARY OF THE INVENTION

According to the invention, in an integrated circuit test device for automatically creating a test pattern, when a selection needs to be made in a signal value assignment for a test pattern, there is proposed cost functions (Flip-based Cost Functions) for selecting the signal value assignment so as to reduce a difference from a random number pattern generated by a pseudo random number pattern generator in the circuit.

In the ATPG, various selections need to be made in the process of creating a test pattern, which selections are made in accordance with a certain selection standard. As the selection standard, two cost functions of controllability and observability are used. The controllability represents a difficulty in setting a value to a signal line. The observability represents a difficulty in propagating a fault value of a signal line to an observation point.

According to the invention, in selecting a signal value assignment for a test pattern, the controllability and observability are adopted as cost functions, and a processing is performed in order to select signal values so as to make the difference from a random number pattern as small as possible based on calculation results of the cost functions.

The ATPG also has a list of failures to be detected, in which list the failures are sorted in accordance with a certain standard, and a test pattern for detecting a failure is generally created in descending order from the failure of the highest order in the list.

In the invention, since a random number pattern sequence generated by a pseudo random number pattern generator is provided beforehand, a failure having a small difference from each random number pattern is selected. A testability is adopted as a cost function for selecting a failure to which the test pattern is targeted. The testability is the difficulty in detecting a failure on a signal line. The testability can be calculated for a random number pattern provided beforehand by means of the above described two cost functions of the controllability and observability. This enables the cost reduction rate to be further increased.

An integrated circuit test device, according to the present invention, for automatically creating a test pattern, comprising: a first cost function calculation means, when a value needs to be selected in a signal value assignment for an inputted pattern, for calculating a controllability representing a difficulty in setting a value to a signal line; and a path-sensitization means for selecting the signal value assignment so as to enable the number of inversions of controllable external inputs of the pattern to be reduced based on the controllability, and for performing path-sensitization.

Further, an integrated circuit test device, according to the invention, for automatically creating a test pattern, comprising: a second cost function calculation means, when a value needs to be selected in a signal value assignment for an inputted pattern, for calculating an observability representing a difficulty in propagating a failure of a signal line to an observation point; and a path-sensitization means for selecting the signal value assignment so as to enable the number of inversions of controllable external inputs of the pattern to be reduced based on the observability, and for performing path-sensitization.

Further, an integrated circuit test device, according to the invention, for automatically generating a test pattern, comprising: a third cost function calculation means, when a failure to be detected by an inputted pattern is selected, for calculating a testability representing a difficulty in detecting a failure on a signal line; and a target failure selection means for selecting a targeted failure from all failures assumed to be in the circuit based on the testability.

The integrated circuit test device, according to the invention, creates a failure list including all failures assumed to be in a circuit, and takes out, for example, a random number pattern generated by a pseudo random number pattern generator. Signal values in the circuit are then determined by a logic simulation using the random number pattern, so that the controllability and observability for the entire circuit are calculated, as a result of which the testability based on the controllability and observability is calculated. Subsequently, a failure having the lowest testability is selected from the failure list to be a target failure, to which a path-sensitization is performed by using the controllability and observability of the random number pattern, so that inversions of controllable external inputs (signal values) of the random number pattern are selected to minimize the number of the inversions, as a result of which the random number pattern is corrected in accordance with the selection. Further, a failure simulation is performed using the corrected pattern, and when another failure to be detected exists, the failure is eliminated from the failure list.

DETAILED DESCRIPTION OF THE PREFERRED EMBODIMENTS

Figure 1:
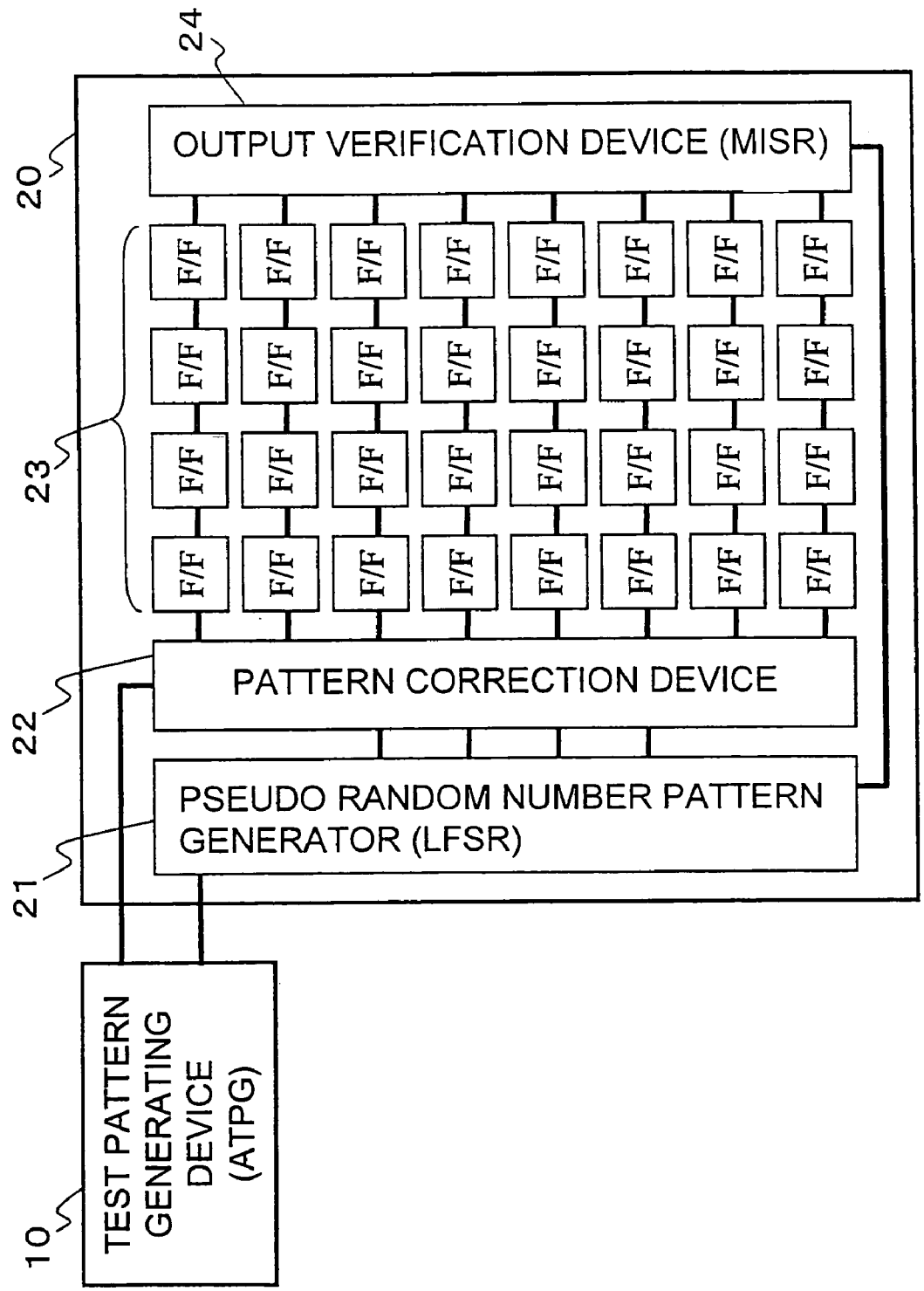
FIG. 1 is a block diagram of an integrated circuit test device according to the invention.

FIG. 1 shows a block diagram of an integrated circuit test device according to the invention.

The integrated circuit test device comprises a test pattern generating device (ATPG) 10 and a circuit 20. The circuit 20 is provided with a pseudo random number pattern generator (LFSR) 21, a pattern correction device 22, a scan path 23, and an output verification device (MISR) 24.

The pseudo random number pattern generator (LFSR) 21 is a means for generating a random number pattern 30 by a pseudo random number. The pattern correction device 22 is a means for inverting some values of the random number pattern 30 generated by the LFSR 21 in accordance with a control signal 32 from the test pattern generating device (ATPG) 10, and for shifting the values in the scan path 23. The output verification device (MISR) 24 is a means for compressing and storing outputs from the scan path 23.

Figure 2:
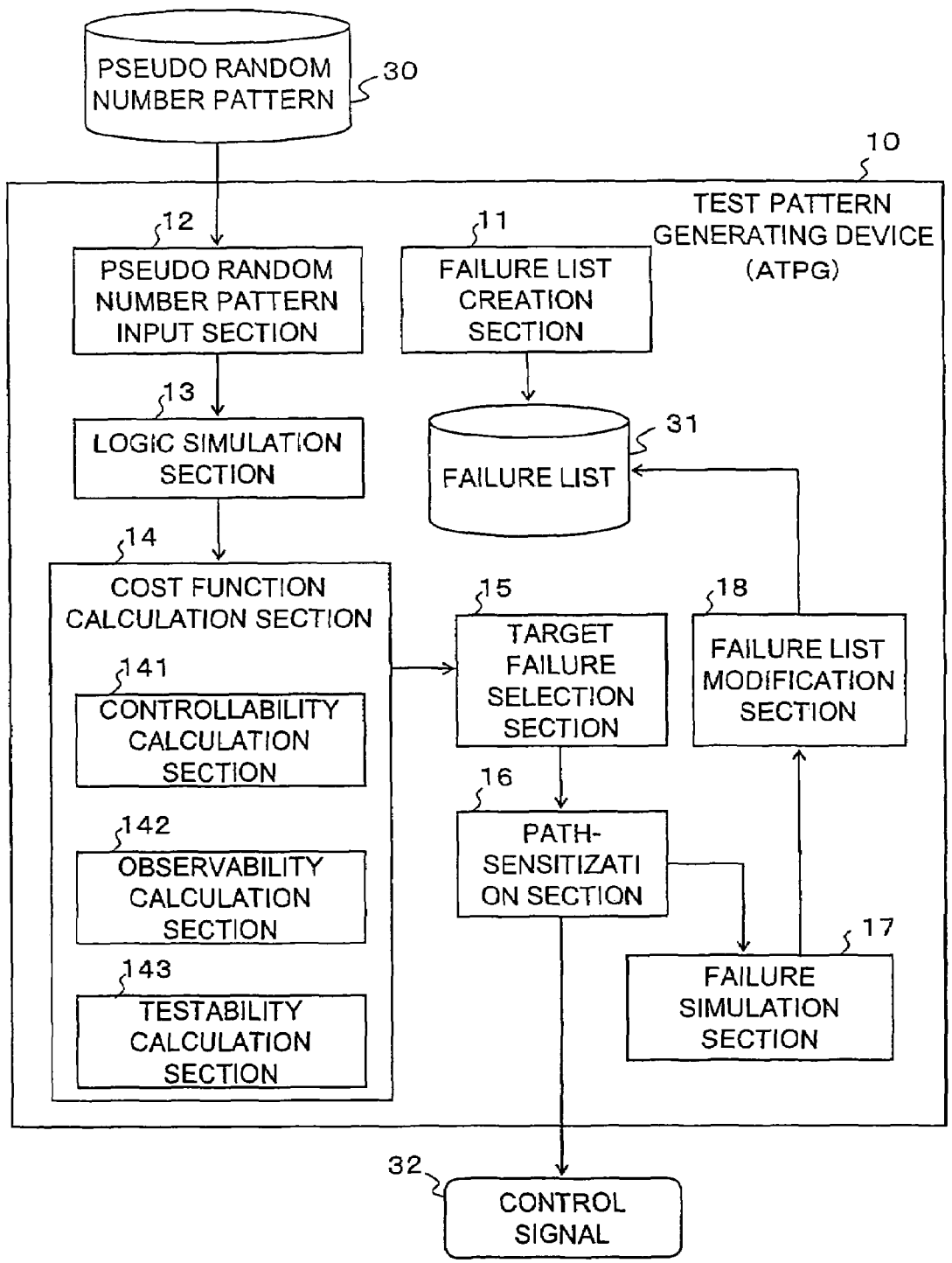
FIG. 2 is a figure showing internal configuration of a test pattern generator.

FIG. 2 shows an internal configuration of the test pattern generating device (ATPG) 10. The ATPG 10 comprises a failure list creation section 11, a random number pattern input section 12, a logic simulation section 13, a cost function calculation section 14, a target failure selection section 15, a path-sensitization section 16, a failure simulation section 17 and a failure list modification section 18.

The failure list creation section 11 is a means for creating a failure list 31 including all failures assumed to be in the circuit. The random number pattern input section 12 is a means for taking out a random number pattern 30 created by the LFSR 21 constituted in the circuit 20. The logic simulation section 13 is a means for performing a logic simulation based on the random number pattern 30 inputted by the random number pattern input section 12 so as to determine signal values in the circuit.

The cost function calculation section 14 is a means for calculating cost functions of controllability, observability and testability, respectively. The cost function calculation section 14 comprises a controllability calculation section 141 for calculating a controllability $C(x)$, an observability calculation section 142 for calculating an observability $O(x)$, and a testability calculation section 143 for calculating a testability $T0(x)$ for detecting 0-degenerate failure and a testability $T1(x)$ for detecting 1-degenerate failure.

The target failure selection section 15 is a means for selecting as a target failure a failure having the lowest testability calculated by the cost function calculation section 14 from failures in the failure list 31.

The path-sensitization section 16 is a means for performing path-sensitization for the target failure selected by the target failure selection section 15 using the cost functions of controllability and observability, for creating a correction pattern in which some controllable external inputs (signal values) of the random number pattern 30 are inverted, and for outputting a control signal 32 for inverting values of the random number pattern 30.

The failure simulation section 17 is a means for performing a failure simulation using the correction pattern so as to extract another failure to be detected. The failure list modification section 18 is a means for eliminating from the failure list 31 the failure to be detected extracted by the failure simulation section 17.

Figure 3:
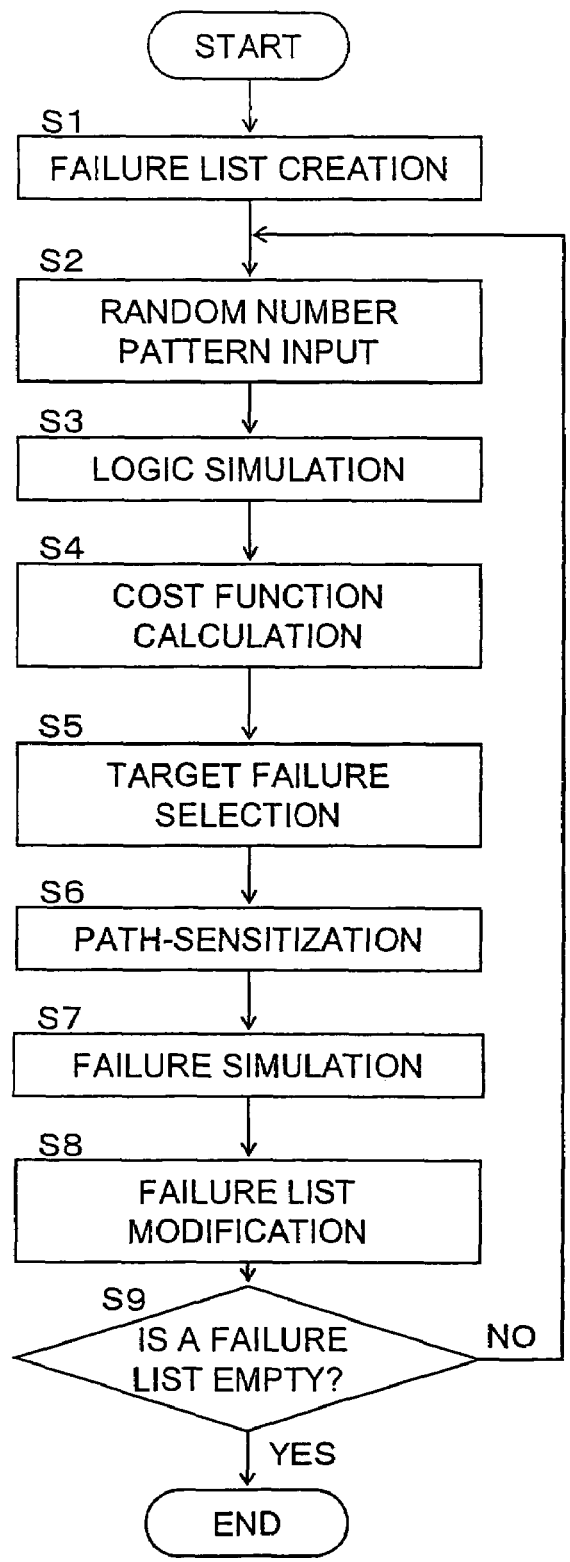
FIG. 3 is a figure showing a processing flow of a test method according to the invention.

FIG. 3 shows a processing flow of the invention. In the ATPG 10, the failure list 31 which includes all failures assumed to be in the circuit is created by the failure list creation section 11 (step S1). A random number pattern 30 is then taken out from the LFSR 21 by the random number pattern input section 12 (step S2). A logic simulation based on the inputted random number pattern 30 is then performed by the logic simulation section 13, so that signal values in the circuit are determined (step S3). The logic simulation is performed by a known method.

Next, the cost functions of controllability C(x), observability O(x) and testabilities T0(x), T1(x) are calculated by the cost function calculation section 14 for the whole circuit in which signal values are determined (step S4).

The controllability C(x) is defined as representing a difficulty in inverting a signal value of a signal line x. In the case of an AND gate having n inputs, assuming that the controllability of all inputs is known, the controllability of output C(x) is calculated as follows.

If (state(x)="0") then $C(x)=\Sigma(i=1$ to $n)$ {state($i$)="0"?$C(i)$:0} else $C(x)=\min(i=1$ to $n)$ {$C(i)$}   equation (1)

where state (x) represents a signal value of a signal line x.

Calculation of the controllability C(x) of the entire circuit is performed by first giving 1 to the controllability of an external input, i.e., a random number pattern 30, and by repeating the calculation according to the above equation (1) in a recursive manner from the external input toward the external output. As a result, the controllability C(x) represents the number of external inputs needed to be inverted in order to invert the signal value of the signal line x.

An observability O(x) is defined as representing a difficulty for propagating a failure of a signal line x to an observation point. In the case of an AND gate having n inputs, assuming that the controllability of all inputs and the observability O(x) of the output x are known, the observability O(d) of an input d is calculated as follows.

$O(d)=O(x)+\Sigma(i=1$ to $n$, $i \ne d)$ {state($i$)="0"? $C(i)$:0}   equation (2)

Calculation of the observability O(x) of the entire circuit is performed by first giving 0 to the observability O(x) of an external output after calculating the controllability C(x) of the entire circuit, and by repeating the calculation according to the above equation (2) in a recursive manner from the external output toward the external input. As a result, O(x) represents the number of external inputs need to be inverted, in order to propagate the failure of a signal line x to the observation point.

Testabilities T0(x) and T1(x) are defined as representing difficulties in creating test pattern for detecting 0-degenerate failure and 1-degenerate failure on a signal line x, respectively. Testabilites T0(x), T1(x) are calculated as follows.

$T0(x)=O(x)+\{\text{state}(x)="0"?C(x):0\}$   equation (3)

$T1(x)=O(x)+\{\text{state}(x)="0"?0:C(x)\}$   equation (4)

As shown in the above described equations (3) and (4), the testability of all failures can be calculated by using the controllability C(x) and the observability O(x) of the entire circuit.

Here, it is necessary to consider that calculations of the controllability C(x), observability O(x) and testabilities T0(x), T1(x) are different depending upon a given input pattern, and the cost functions need to be recalculated each time an input pattern, here, an external input signal of the random number pattern 30 is inverted. In this case, besides the method of re-calculating the cost functions of the entire circuit, it is also possible to perform recalculation only for the effect range of the inverted external inputs so as to increase the calculation speed.

Figure 4:
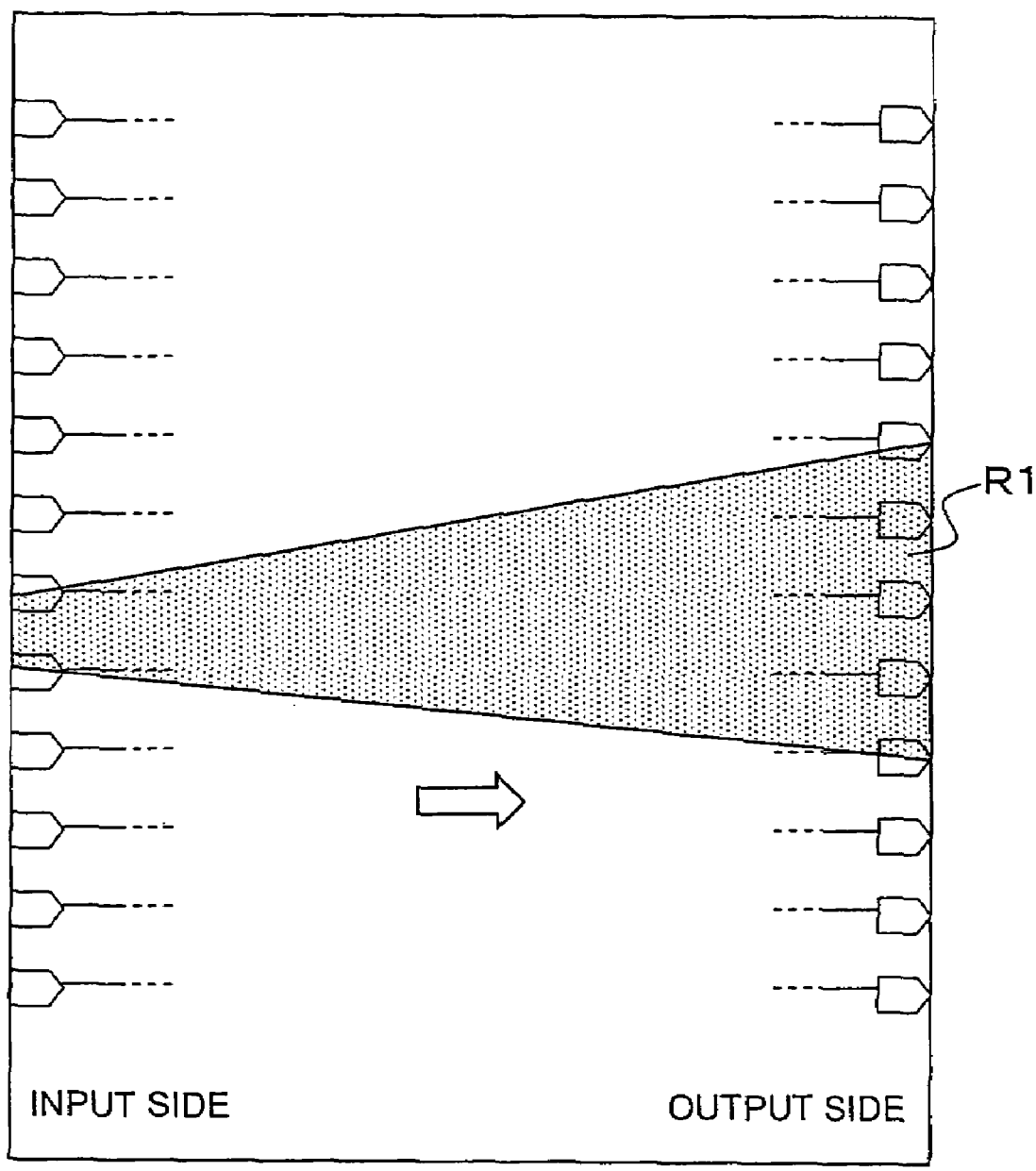
FIG. 4 is a figure showing a re-calculation range of a controllability.

Specifically, the re-calculation range of the controllability is limited to a range in which the effect of inverted external inputs is propagated forward. That is, the re-calculation range R1 of the controllability C(x) is limited, as shown in FIG. 4, within a range spreading in a cone form from inverted inputs at the input side to the output side in the circuit.

Figure 5:
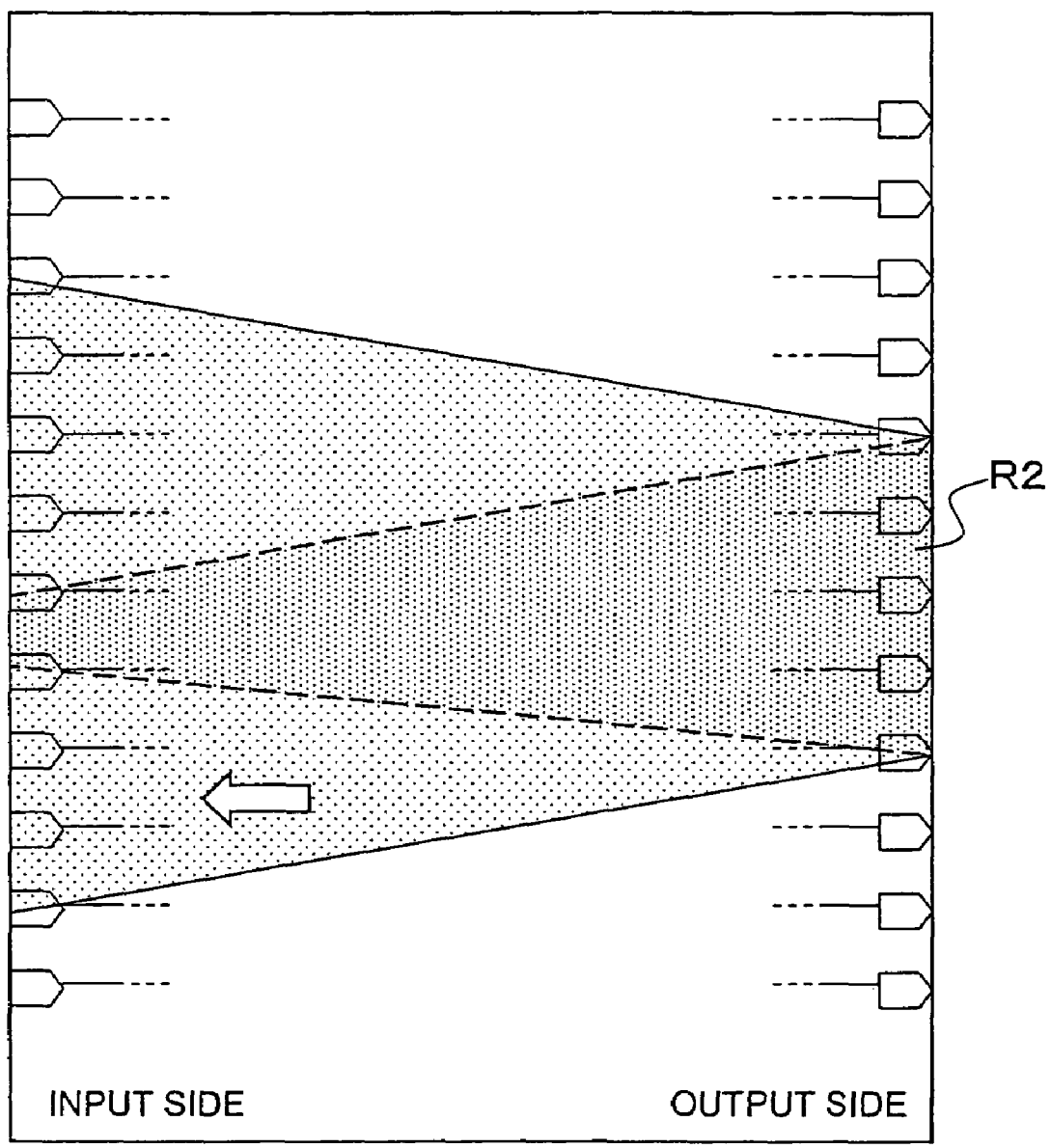
FIG. 5 is a figure showing a re-calculation range of an observability and testability.

The re-calculation range of the observability O(x) and the testabilities T0(x), T1(x) is limited to a range which can be back-traced in a reversed direction, this time, from external outputs which the effect of the inverted external inputs reached toward the external inputs. That is, the re-calculation range R2 of the observability O(x) and the testabilities T0(x), T1(x) is limited, as shown in FIG. 5, within a range spreading in a cone form from output signals within a range affected by the inversion at the output side toward the input side.

Next, a failure having the lowest testability T0(x)/T1(x) among failures in the failure list 31 is selected by the target failure selection section 15, so as to be set as a target failure (step S5).

In the path-sensitization section 16, the path-sensitization for the target failure is then performed using the above described cost functions, so that a correction pattern is created in which some controllable external inputs (signal values) of the inputted random number pattern 30 are inverted, so as to enable the control signal 32 for inverting the external inputs of the random number pattern 30 to be outputted (step S6).

The path-sensitization using the cost functions is performed as follows. When a fault value of a target fault point coincides with a current signal value, a fault-excitation is performed to enable 0-degenerate failure or 1-degenerate failure to be occurred. In the fault-excitation, a rear search is performed up to an external input using the controllability C(x) as a guide. A logic simulation is performed with searched signal values of the external input inverted, so that re-calculation of the controllability C(x) and observability O(x) is performed with the controllability C(x) made infinite ($\infty$). The purpose of making the controllability C(x) infinite ($\infty$) is to prevent repeating the inversion of the same external inputs at the time of subsequent back-tracing. Coincidence of the signal value of the target fault point is checked once more, and the rear search is repeated as long as the coincidence continues. During the process, when the controllability of a target fault point becomes infinite ($\infty$), the back-tracking is performed.

Next, the fault-effect propagation is performed. When a gate, which has a fault value at the input, and the observability O(x) of which output is not infinite ($\infty$), is defined as a D frontier, the fault-effect propagation is to advance the D frontier to an external output. When there are a plurality of D frontiers, a D frontier is selected, the rear search is performed up to an external input using the controllability C(x) as a guide, in order to set a non-controlling value (1 for AND gate and 0 for OR gate) at inputs having values other than the fault value. The signal values of the external input are inverted so that a logic simulation is performed, and the controllability C(x) is then made infinite ($\infty$), so that the re-calculation of the controllability C(x) and observability O(x) is performed. The propagation processing of the D frontier is repeated once more, and when the D frontier reaches an external output, the path-sensitization is assumed to be successful. In the case where the D frontier is lost on the way, the back-tracking is performed.

A procedure of the path-sensitization using the cost functions is specifically described using simplified examples shown in FIGS. 6 to 9.

Figure 6:
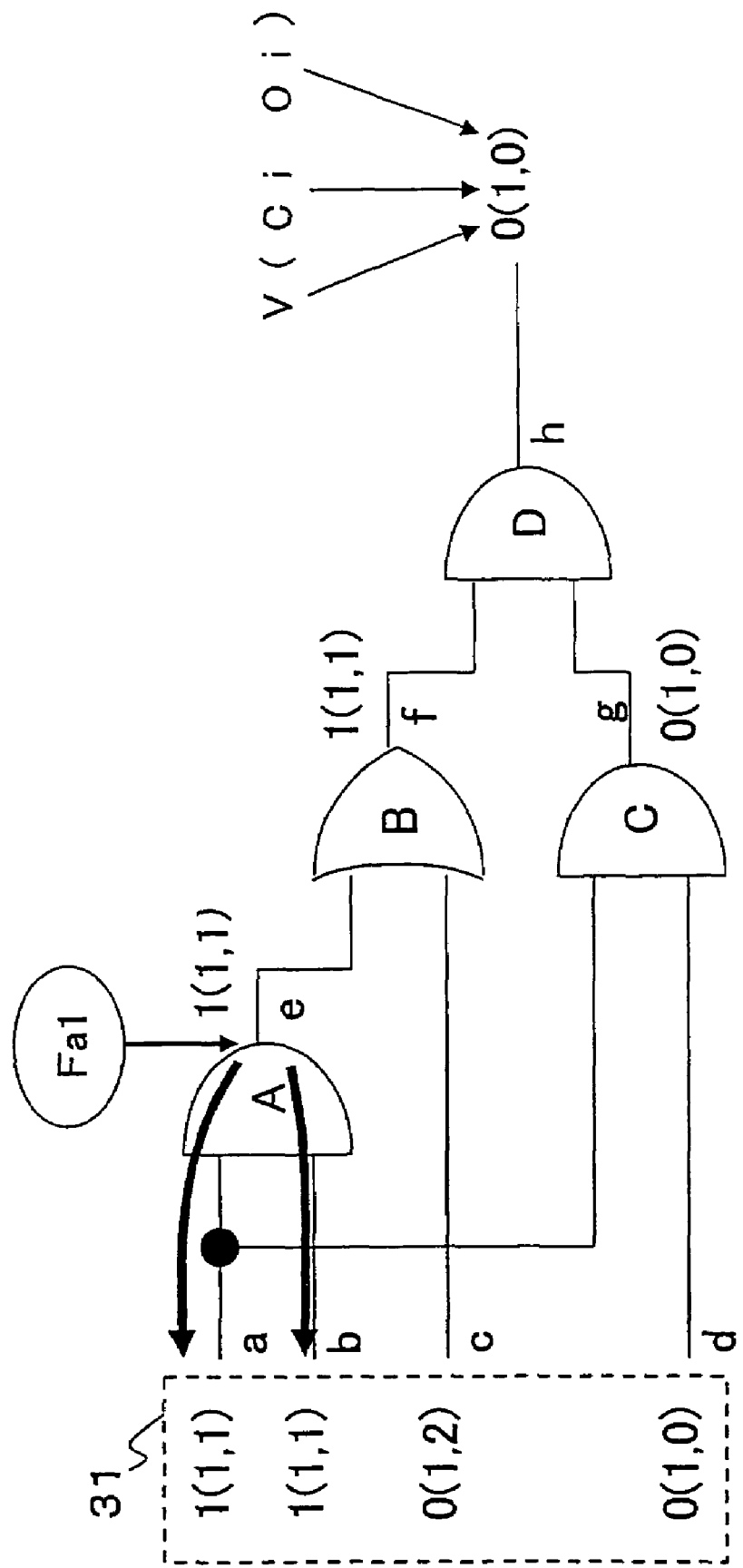
FIG. 6 is an illustration 1 of a path-sensitization.

FIG. 6 shows a circuit and a given example of random number pattern. FIG. 6 also shows results of logic simulation and of calculation of the cost functions, which are performed for the circuit. Here, values in a parenthesis following an output signal value V of a random number pattern 30 and of an output of the gate represent the controllability Ci and the observability Oi, respectively. For example, a signal line h is represented as: the signal value V (Controllability Ci, observability Oi)=0 (1, 0).

Here, there is considered a case where 1-degenerate failure Fa1 of a signal line e is to be detected as a target failure. Since the signal value V of the target fault point (output side of AND gate A) is 1 and coincides with the fault value, it is necessary to perform the fault-excitation. A rear search is performed using controllability C(x) as a guide from the signal line e. As shown in FIG. 6, it can be seen that either of the signal lines a or b may be inverted. Here, as shown by a thick arrow line in the figure, the signal line a is assumed to be selected as an input to inverted.

Figure 7:
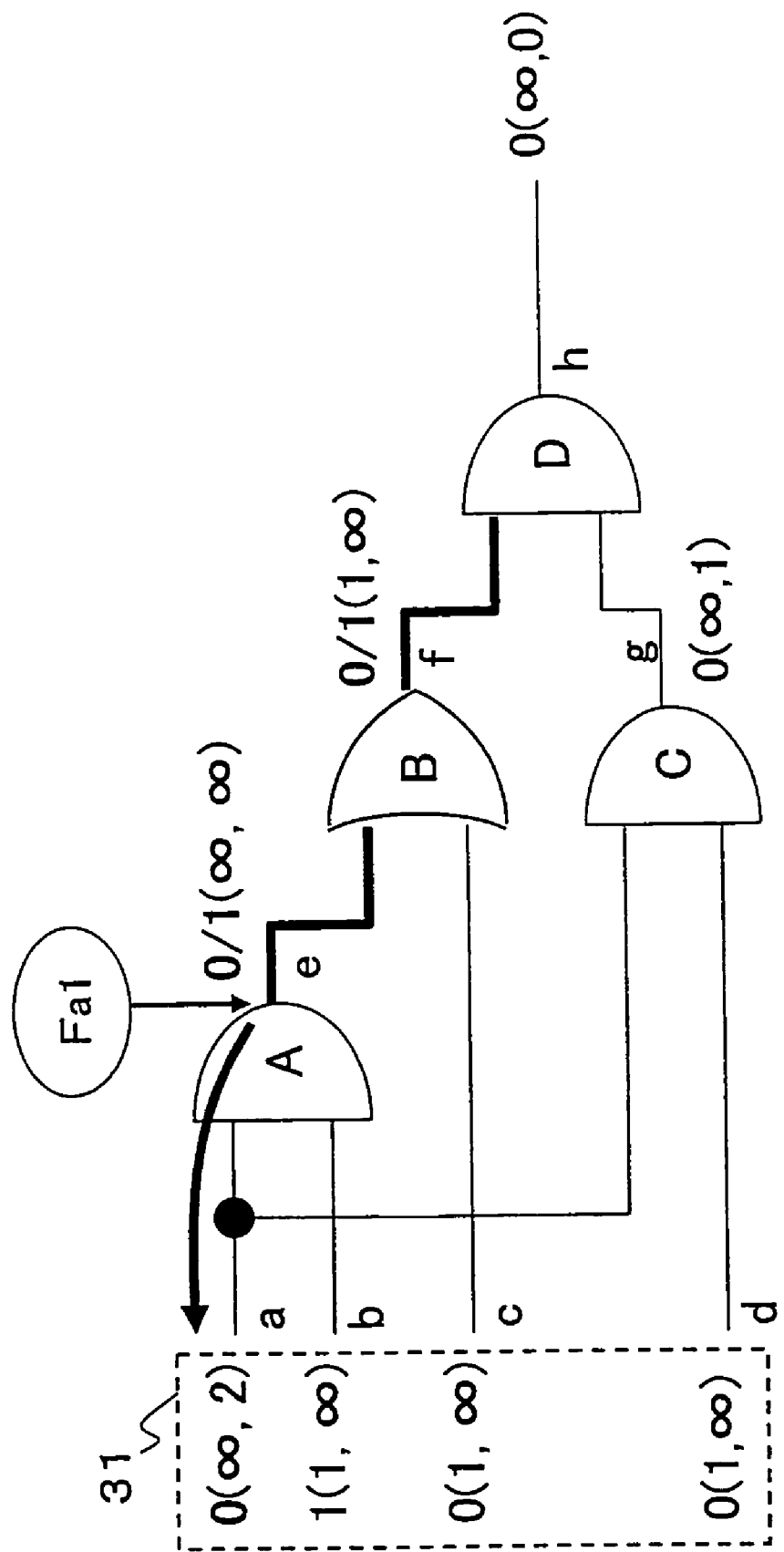
FIG. 7 is an illustration 2 of a path-sensitization.

FIG. 7 shows results of logic simulation and of re-calculation of the cost functions, in the case where the signal value of the signal line a is inverted. Although the signal line e and the signal line f are sensitized, it can be seen that the observability Oi=O(x) in both signal lines is infinite ($\infty$), and there is no D frontier (DF). Then, back-tracking is performed.

Figure 8:
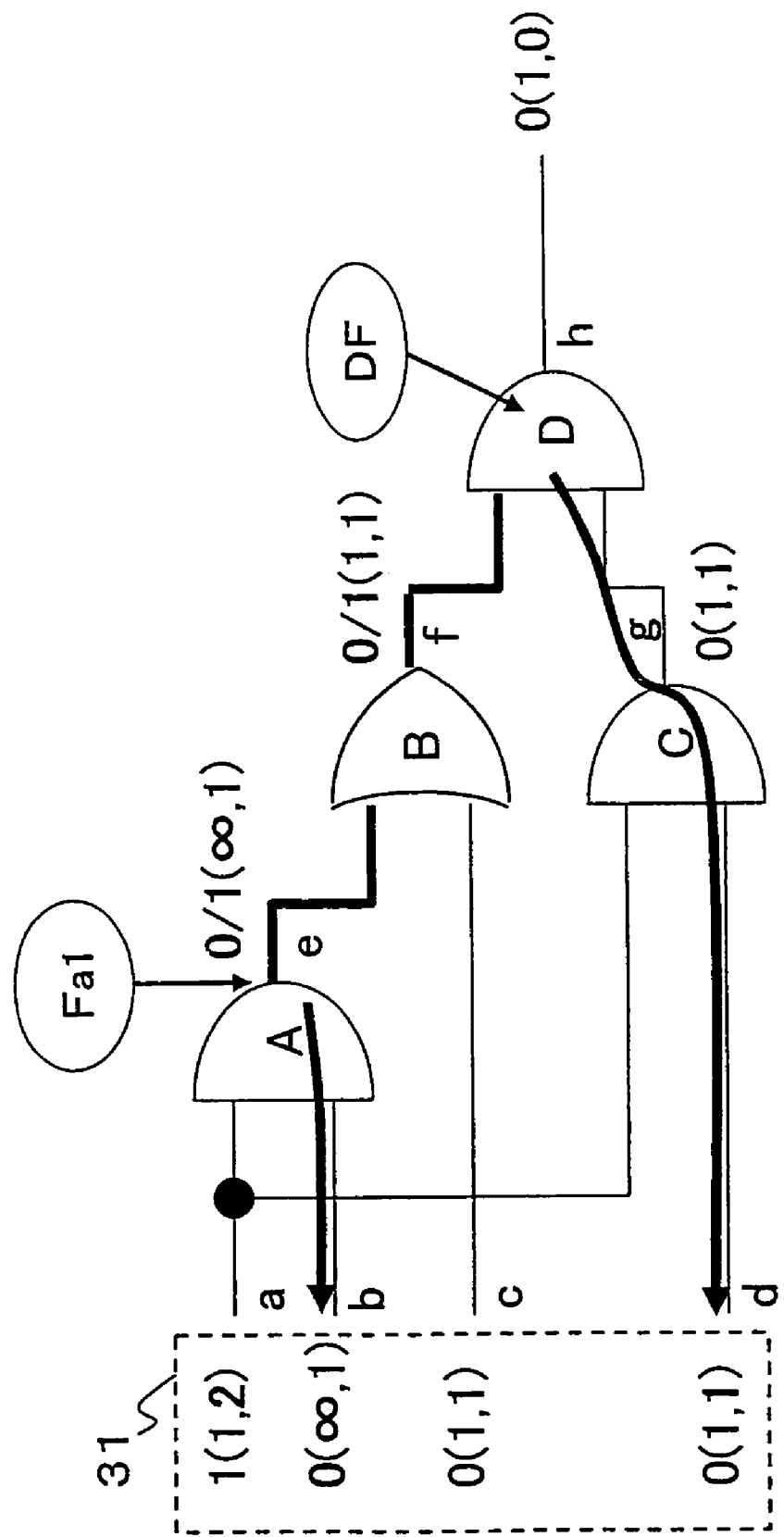
FIG. 8 is an illustration 3 of a path-sensitization.

As a result of the back-tracking, the selection of the signal line a is canceled and the signal value V of the signal line b is inverted for the fault-excitation. FIG. 8 shows results of logic simulation and of re-calculation of the cost functions, in the case where the signal value of the signal line b is inverted. Here, when attention is directed to AND gate D, the AND gate D is seen to be as D frontier (DF) because it has a fault value at an input pin and the observability Oi is not infinite ($\infty$).

Figure 9:
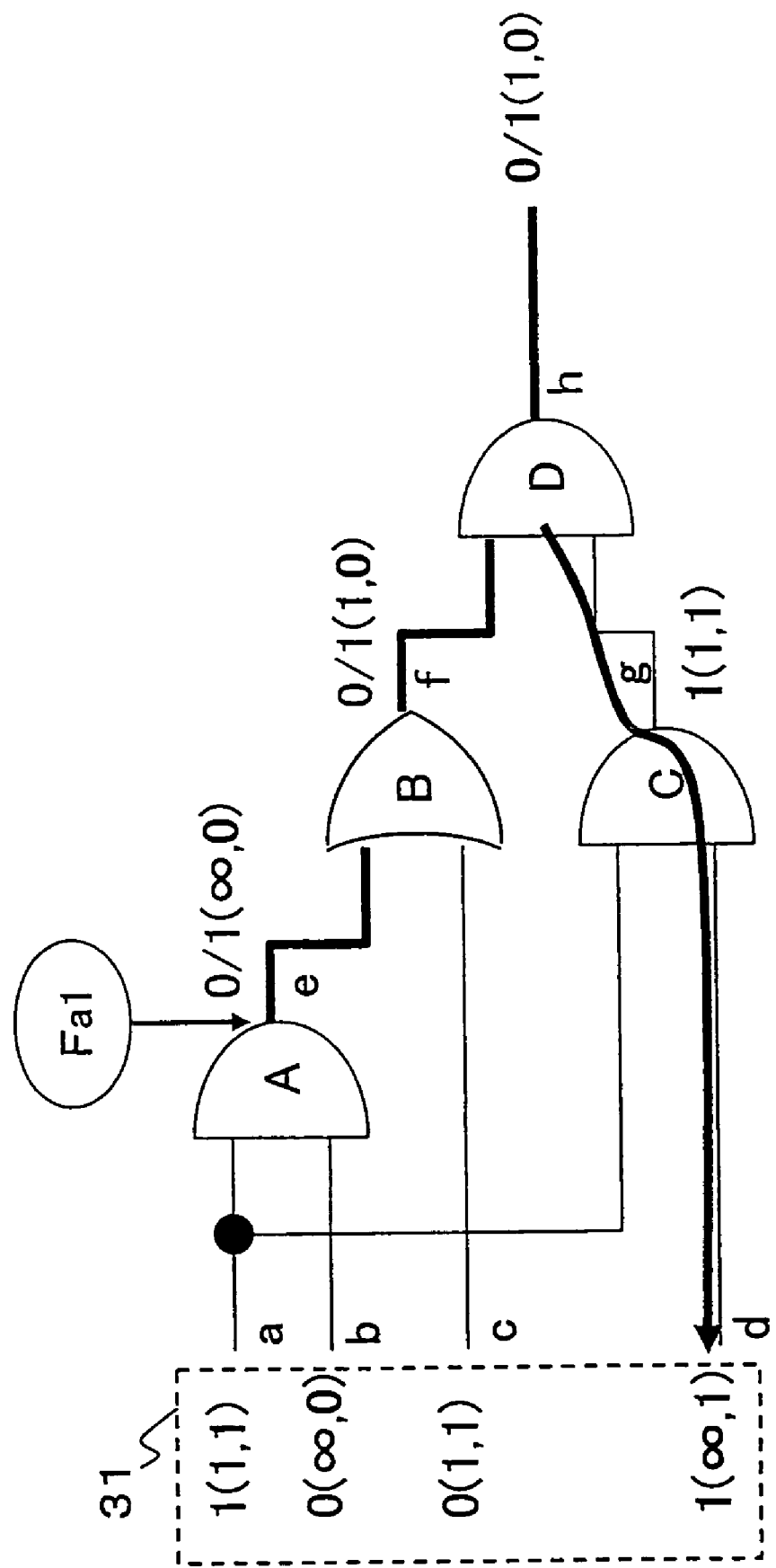
FIG. 9 is an illustration 4 of a path-sensitization.
Figure 10:
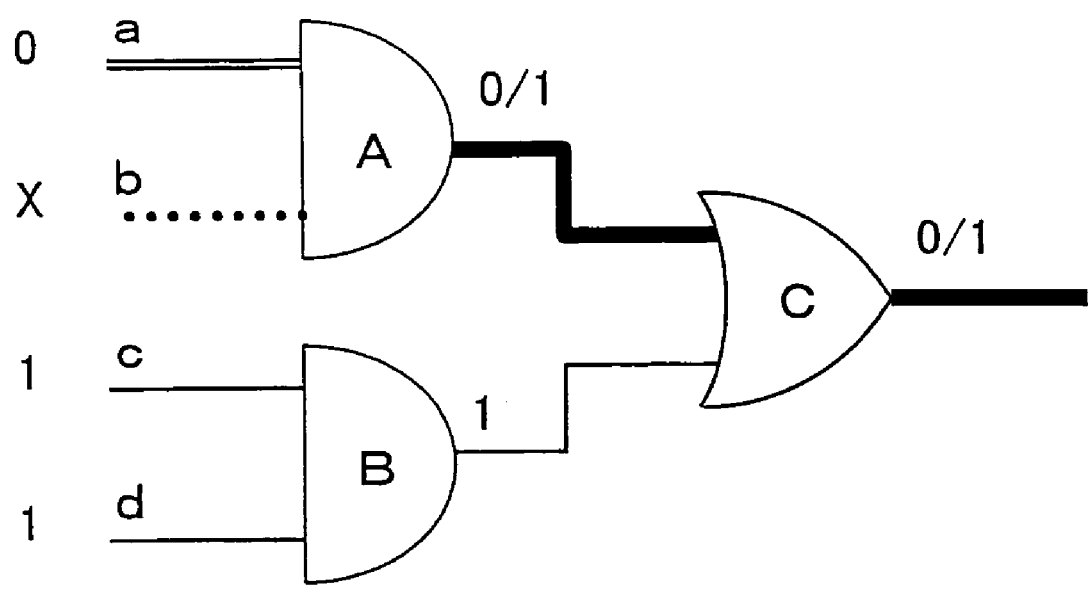
FIG. 10 is a figure showing an example of a sensitized path.
Figure 11:
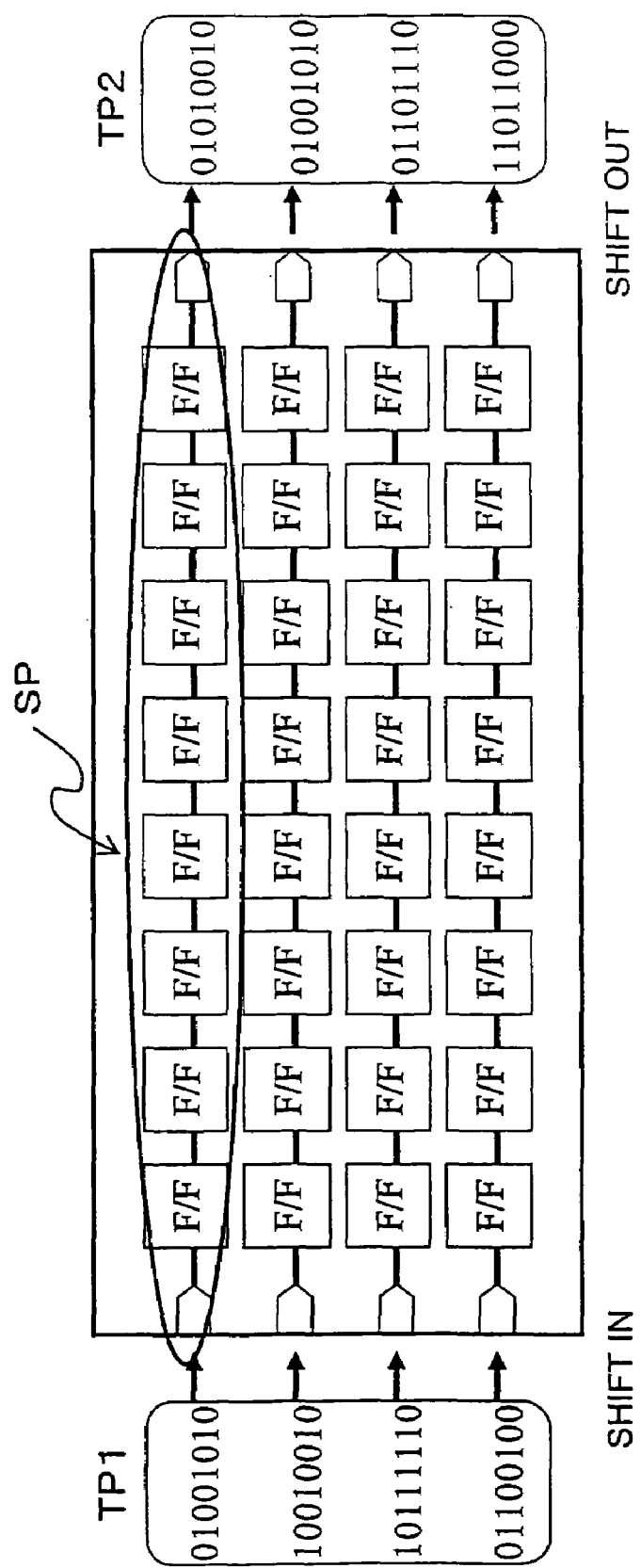
FIG. 11 is a conceptual diagram of DSPT.
Figure 12:
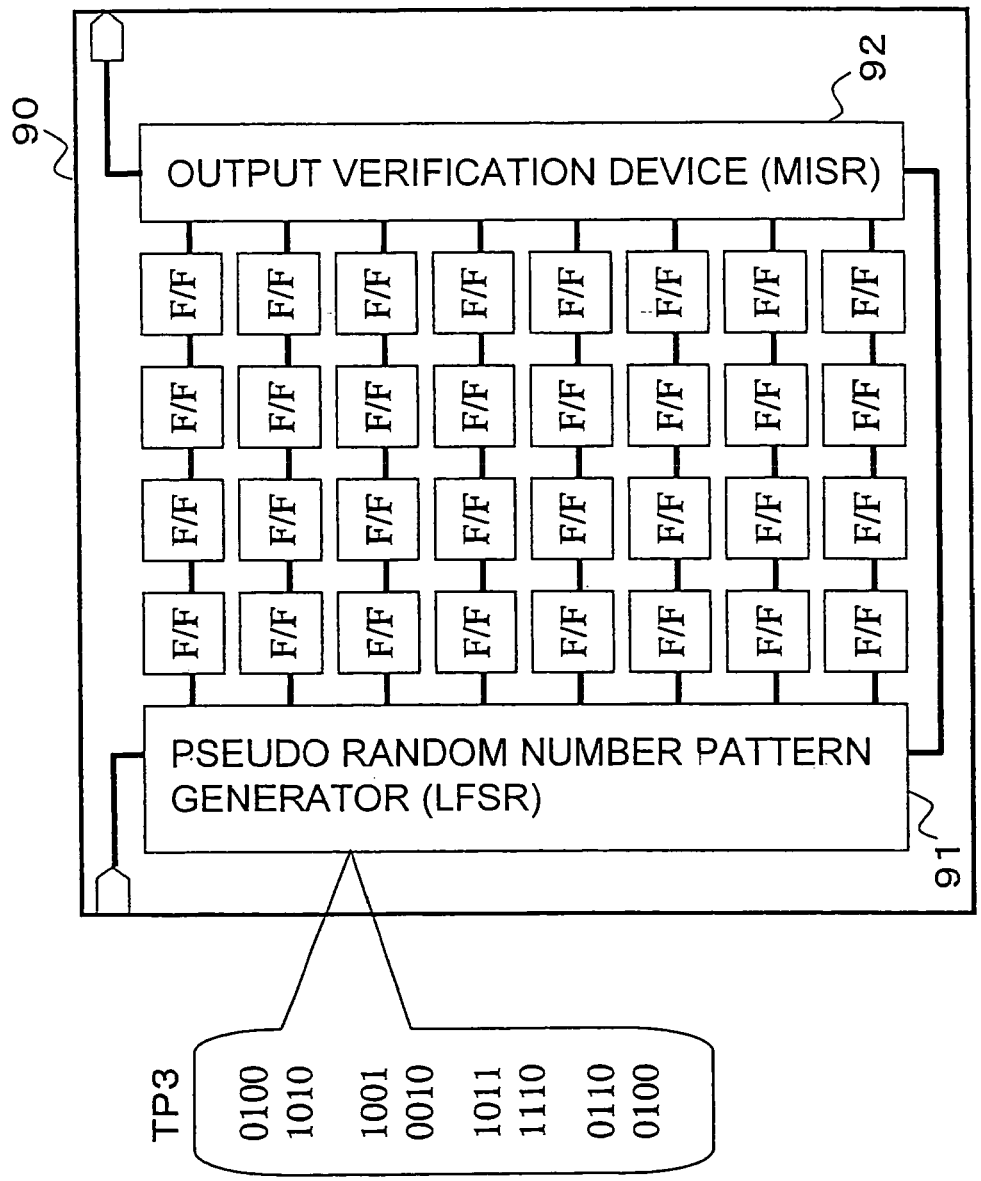
FIG. 12 is a conceptual diagram of BIST.
Figure 13:
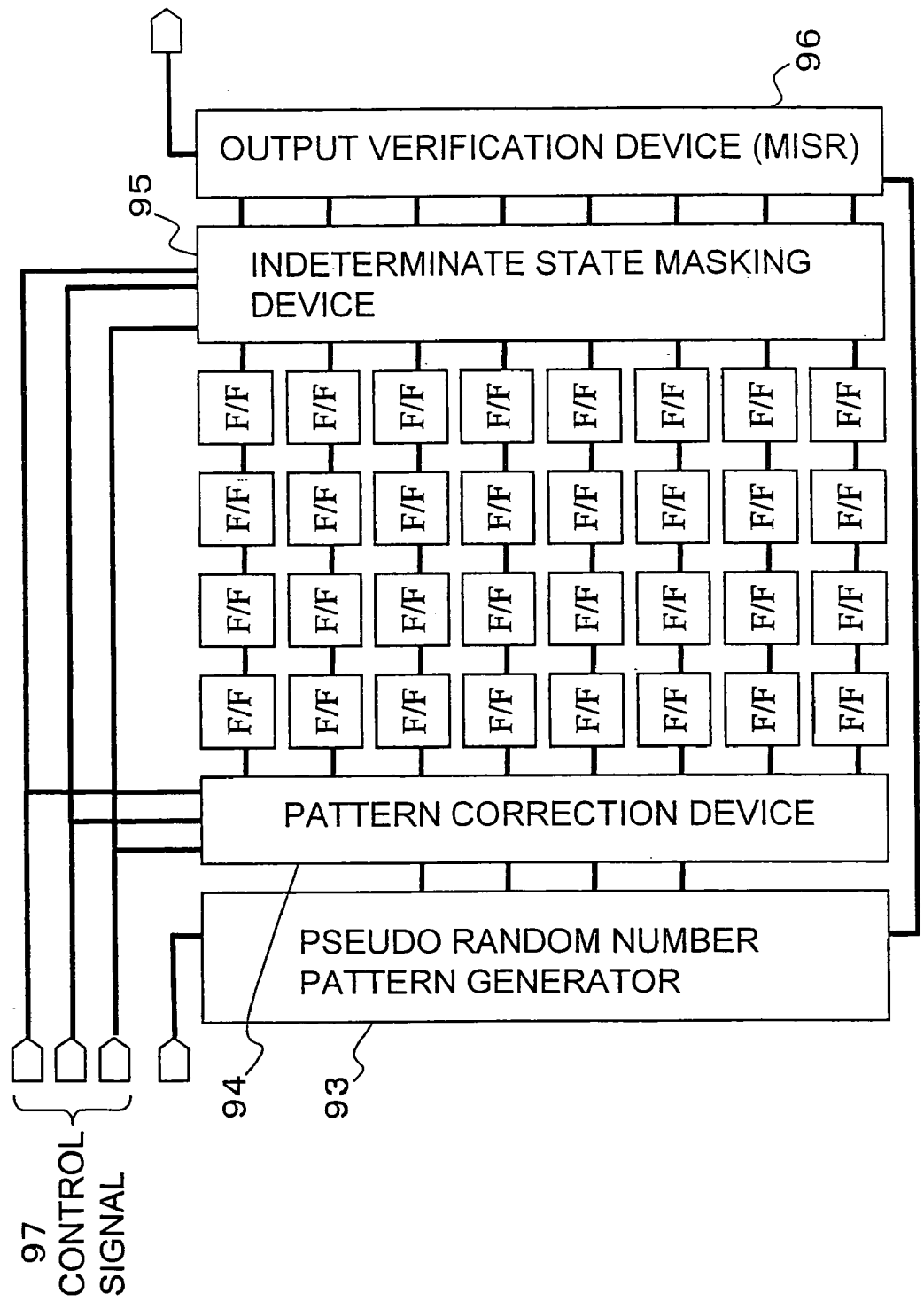
FIG. 13 is a block diagram of a circuit of a test device disclosed in Japanese Patent Application Serial No. H12-372231, "Device and Method for Testing Integrated Circuit Device".

Then, fault effect propagation processing to the AND gate D is performed. A rear search is performed using the controllability Ci=C(x) as a guide from the input (signal line g) to which 1-degenerate failure Fa1 of AND gate D has not yet propagated, so that it is seen to be necessary that a signal line d is inverted. FIG. 9 shows results of logic simulation and of re-calculation of the cost functions performed by inverting the signal value of the signal line d. As a result, the sensitized path leading to a signal line h is formed, and a test pattern which detects 1-degenerate failure Fa1 of the signal line e is created. Then, the signal value V of the signal lines a and d is inverted with respect to the random number pattern 30, and a correction pattern is generated.

The control signal 32 for inverting the signal value V of signal lines a and d in the random number pattern 30 is sent out to the pattern correction device 22. The random number pattern 30 is corrected by the pattern correction device 22 in accordance with the control signal 32, so as to be shifted in the scan path 23.

In the failure simulation section 17, the fault point and the correction pattern are acquired, so that a failure simulation is performed for extracting another failure to be detected (step S7), as a result of which the failure detected by the failure simulation section 17 is eliminated from failure list 31 by the failure list modification section 18 (step S8).

Subsequently, after the failure is eliminated by the failure list modification section 18, when the failure list 31 is not yet emptied of remaining failures (step S9), the processing is returned to step S2, or when the failure list 31 is empty, the processing is ended.

As a further embodiment of the invention, a processing procedure can be considered in which in the ATPG 10 only the failure simulation is performed for the first several tens patterns by directly using the random number patterns 30 from the LFSR 21. This is because it is advantageous in an aspect of processing time that most (50% to 80%) failures inside the circuit can be detected by the random number pattern, so that test patterns for detecting only failures left undetected need to be generated by the ATPG 10. In the ATPG 10 in this case, first several tens of the random number patterns 30 generated by the LFSR 21 are taken out as they are by the random number pattern input section 12, so that failure simulations are performed by the failure simulation section 17 using the extracted random number patterns 30. Also, the random number patterns 30 which are taken out thereafter are processed in accordance with the processing flow shown in FIG. 3.

As a further embodiment of the invention, there is considered a processing procedure in which in addition to performing path-sensitization for a target failure using a random number pattern, a failure simulation is performed after path-sensitization to a plurality of failures is attempted. This processing is an application of a known technique referred to as the dynamic compaction to the present invention, and has a substantial effect in reducing the number of patterns.

In this case, in the ATPG 10, when a target failure is selected by the target failure selection section 15 in accordance with the processing flow shown in FIG. 3, a plurality of failures to be detected by means of a random number pattern are arranged to be selected, so that the subsequent processing is performed for the selected plurality of failures.

Although the present invention has been described in accordance with the embodiments shown, various variations are possible within the scope and spirit of the invention.

Although a processing in which both of the controllability and observability are used as the cost functions has been described as an embodiment of the present invention, for example, the ATPG 10 can also perform the test pattern creation using either of the cost functions.

Further, the random number pattern input section 12 of the ATPG 10 may create a pattern similar to the random number pattern 30 generated by the LFSR 21, instead of taking out the pattern from the LFSR 21.

Further, the random number pattern input section 12 may use a test pattern created by the processing of one previous step, instead of taking out the random number pattern 30 from the LFSR 21.

Further, the path-sensitization section 16 may be arranged to output a correction pattern instead of the control signal 32.

Each means or function or element of the invention can be realized as a processing program which is read and executed by a computer. The program for realizing the present invention, which can be stored in a suitable computer readable recording medium, such as a portable medium memory, a semiconductor memory and a hard disk, is provided recorded on such recording media, or provided by transmission and reception using various communication networks via communication interfaces.

As described above, a device and method for testing an integrated circuit device, according to the invention, can be utilized for detecting a production failure of an integrated circuit and the like.

The integrated circuit test device for automatically creating a test pattern, according to the invention, when a signal value assignment needs to be selected, performs path-sensitization, so as to enable inversions of an external input of a random number pattern generated by the LFSR to be minimized in accordance with the cost functions. The integrated circuit test device then generates a correction pattern with inverted inputs of the random number pattern and performs verification of the circuit by using the correction pattern. This enables the difference base on the random number pattern to be reduced as much as possible and as many failures as possible to be detected, thereby allowing the reduction of test costs to be expected.

In addition, the invention is very effective when applied to a test device disclosed in Japanese Patent Application Serial No. H12-372231, "Device and Method for Testing Integrated Circuit". The test device disclosed in the patent application, which device is provided with the LFSR in the circuit, is capable of drastically reducing the amount of test data in the case where the difference between a pattern created by the ATPG and a random number pattern, thereby reducing the test time.

Further, according to the invention, a test pattern created in the processing of one previous step is used instead of a random number pattern to be inputted, thereby enabling a test pattern having small signal variations to be created. The use of a test pattern with suppressed signal variations enables the power consumption of an integrated circuit during test to be reduced. The invention is effective in the case where the power consumption during test is desired to be reduced due to a high integration of the circuit.

The invention may be embodied in other specific forms without departing from the sprit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An integrated circuit test device for automatically generating a test pattern, comprising:
   a cost function calculation means, when a value needs to be selected in a signal value assignment for an inputted pattern, for calculating a controllability representing a difficulty in setting a value to a signal line, wherein the controllability represents a number of external inputs required in order to reverse a value of a target point in the inputted pattern; and
   a path-sensitization means for selecting the signal value assignment so as to enable the number of inversions of controllable external inputs of the pattern to be reduced based on the controllability, and for performing path-sensitization.

2. The integrated circuit test device according to claim 1, further comprising:
   a cost function calculation means, when a failure to be detected by an inputted pattern is selected, for calculating a controllability representing a difficulty in detecting a failure on a signal line; and
   a target failure selection means for selecting a target failure from all failures assumed to be in a circuit based on a testability.

3. An integrated circuit test device for automatically generating a test pattern, comprising:
   a cost function calculation means, when a value needs to be selected in a signal value assignment for an inputted pattern, for calculating an observability representing a difficulty in propagating a failure of a signal line to an observation point, wherein the observability represents a number of external inputs required in order to observe a value of a target point in the inputted pattern; and
   a path-sensitization means for selecting the signal value assignment so as to enable the number of inversions of controllable external inputs of the pattern to be reduced based on the observability, and for performing path-sensitization.

4. The integrated circuit test device according to claim 3, further comprising:
   a cost function calculation means, when a failure to be detected by an inputted pattern is selected, for calculating a controllability representing a difficulty in detecting a failure on a signal line; and
   a target failure selection means for selecting a target failure from all failures assumed to be in a circuit based on a testability.

5. An integrated circuit test device for automatically generating a test pattern, comprising:
   a first cost function calculation means, when a value needs to be selected in a signal value assignment for an inputted pattern, for calculating a controllability representing a difficulty in setting a value to a signal line, wherein the controllability represents a number of external inputs required in order to reverse a value of a target point in the inputted pattern;
   a second cost function calculation means, when a value needs to be selected in a signal value assignment for the pattern, for calculating an observability representing a difficulty in propagating a failure of a signal line to an observation point, wherein the observability represents a number of external inputs required in order to observe a value of a target point in the inputted pattern; and
   a path-sensitization means for selecting the signal value assignment so as to enable the number of inversions of controllable external inputs of the test pattern to be reduced based on the controllability and the observability, and for performing path-sensitization.

6. The integrated circuit test device according to claim 5, further comprising:
   a cost function calculation means, when a failure to be detected by an inputted pattern is selected, for calculating a controllability representing a difficulty in detecting a failure on a signal line; and
   a target failure selection means for selecting a target failure from all failures assumed to be in a circuit based on a testability.

7. An integrated circuit test device for automatically generating a test pattern, comprising:
   a cost function calculation means, when a failure to be detected by an inputted pattern is selected, for calculating a testability representing a difficulty in detecting a failure on a signal line, wherein the testability represents a number of external inputs required to be reversed in order to detect a certain hypothetic fault in the inputted pattern; and
   a target failure selection means for selecting a targeted failure from all failures assumed to be in a circuit based on the testability.

8. An integrated circuit test device which comprises a pattern generator and a pattern correction device for correcting by an external input a pattern generated by the pattern generator, and in which the corrected pattern is inputted into a plurality of scan paths, the integrated circuit test device comprising:
  a first cost function calculation means, when a value needs to be selected in a signal value assignment for a pattern inputted from the pattern generator, for calculating a controllability representing a difficulty in setting a value to a signal line, wherein the controllability represents a number of external inputs required in order to reverse a value of a target point in the inputted pattern;
  a second cost function calculation means, when a value needs to be selected in a signal value assignment for the pattern, for calculating an observability representing a difficulty in propagating a failure of a signal line to an observation point, wherein the observability represents a number of external inputs required in order to observe a value of a target point in the inputted pattern; and
  a path-sensitization means for performing path-sensitization which selects the signal value assignment so as to enable the number of inversions of controllable external inputs of the pattern to be reduced based on the controllability and the observability, and for outputting a control signal for performing the selection to the pattern correction device.

9. The integrated circuit test device according to claim 8, further comprising:
  a cost function calculation means, when a failure to be detected by an inputted pattern is selected, for calculating a testability representing a difficulty in detecting a failure on a signal line; and
  a target failure selection means for selecting a targeted failure from all failures assumed to be in a circuit based on the testability.

10. An integrated circuit test method for automatically generating a test pattern, comprising:
  when a value needs to be selected in a signal value assignment for an inputted pattern, calculating a controllability representing a difficulty in setting a value to a signal line, wherein the controllability represents a number of external inputs required in order to reverse a value of a target point in the inputted pattern; and
  selecting the signal value assignment so as to enable the number of inversions of controllable external inputs of the pattern to be reduced based on the controllability, and performing path-sensitization.

11. The integrated circuit test method according to claim 10, further comprising:
  when a failure to be detected by an inputted pattern is selected, calculating a controllability representing a difficulty in detecting a failure on a signal line; and
  selecting a target failure from all failures assumed to be in a circuit based on a testability.

12. An integrated circuit test method for automatically generating a test pattern, comprising:
  when a value needs to be selected in a signal value assignment for an inputted pattern, calculating an observability representing a difficulty in propagating a failure of a signal line to an observation point, wherein the observability represents a number of external inputs required in order to observe a value of a tarciet point in the inputted pattern; and
  selecting the signal value assignment so as to enable the number of inversions of controllable external inputs of the pattern to be reduced based on the observability, and performing path-sensitization.

13. The integrated circuit test method according to claim 12, further comprising:
  when a failure to be detected by an inputted pattern is selected, calculating a controllability representing a difficulty in detecting a failure on a signal line; and
  selecting a target failure from all failures assumed to be in a circuit based on a testability.

14. An integrated circuit test method for automatically generating a test pattern, comprising:
  when a value needs to be selected in a signal value assignment for an inputted pattern, calculating a controllability representing a difficulty in setting a value to a signal line, wherein the controllability represents a number of external inputs required in order to reverse a value of a target point in the inputted pattern;
  when a value needs to be selected in a signal value assignment for the pattern, calculating an observability representing a difficulty in propagating a failure of a signal line to an observation point, wherein the observability represents a number of external inputs required in order to observe a value of a target point in the inputted pattern; and
  selecting the signal value assignment so as to enable the number of inversions of controllable external inputs of the test pattern to be reduced based on the controllability and the observability, and performing path-sensitization.

15. The integrated circuit test method according to claim 14, further comprising:
  when a failure to be detected by an inputted pattern is selected, calculating a controllability representing a difficulty in detecting a failure on a signal line; and
  selecting a target failure from all failures assumed to be in a circuit based on a testability.

16. An integrated circuit test method for automatically generating a test pattern, comprising:
  when a failure to be detected by an inputted pattern is selected, calculating a testability representing a difficulty in detecting a failure on a signal line, wherein the testability represents a number of external inputs required to be reversed in order to detect a certain hypothetic fault in the inputted pattern; and
  selecting a targeted failure from all failures assumed to be in a circuit based on the testability.

17. An integrated circuit test method which comprises a pattern generator and a pattern correction device for correcting by an external input a pattern generated by the pattern generator, and in which the corrected pattern is inputted into a plurality of scan paths, the integrated circuit test method comprising:
  when a value needs to be selected in a signal value assignment for a pattern inputted from the pattern generator, calculating a controllability representing a difficulty in setting a value to a signal line, wherein the controllability represents a number of external inputs required in order to reverse a value of a target point in the inputted pattern;
  when a value needs to be selected in a signal value assignment for the pattern, calculating an observability representing a difficulty in propagating a failure of a signal line to an observation point, wherein the observability represents a number of external inputs required in order to observe a value of a target point in the inputted pattern; and
  performing path-sensitization which selects the signal value assignment so as to enable the number of inversions of controllable external inputs of the pattern to be reduced based on the controllability and the observability, and outputting a control signal for performing the selection to the pattern correction device.

18. The integrated circuit test method according to claim 17, further comprising:
when a failure to be detected by an inputted pattern is selected, calculating a testability representing a difficulty in detecting a failure on a signal line; and
selecting a targeted failure from all failures assumed to be in a circuit based on the testability.

19. An apparatus for automatically generating a test pattern for testing integrated circuits, comprising:
a calculating unit, when a value needs to be selected in a signal value assignment for an inputted pattern, calculating a controllability representing a difficulty in setting a value to a signal line, wherein the controllability represents a number of external inputs required in order to reverse a value of a target point in the inputted pattern; and
a path-sensitization unit selecting the signal value assignment so as to enable the number of inversions of controllable external inputs of the pattern to be reduced based on the controllability, and performing path-sensitization.

* * * * *

UNITED STATES PATENT AND TRADEMARK OFFICE
CERTIFICATE OF CORRECTION

PATENT NO. : 7,266,746 B2
APPLICATION NO. : 11/023457
DATED : September 4, 2007
INVENTOR(S) : Takahisa Hiraide Page 1 of 1

It is certified that error appears in the above-identified patent and that said Letters Patent is hereby corrected as shown below:

Col. 13, line 60, delete "tarciet" and insert --target--, therefor.

Signed and Sealed this

First Day of April, 2008

JON W. DUDAS
*Director of the United States Patent and Trademark Office*